United States Patent
Ko et al.

(10) Patent No.: US 12,495,490 B2
(45) Date of Patent: Dec. 9, 2025

(54) PRINTED CIRCUIT BOARD AND MANUFACTURING METHOD THEREOF

(71) Applicant: SAMSUNG ELECTRO-MECHANICS CO., LTD., Suwon-si (KR)

(72) Inventors: Young Kuk Ko, Suwon-si (KR); Sanghoon Kim, Suwon-si (KR); Jiho Yoon, Suwon-si (KR); Gyumook Kim, Suwon-si (KR); Taehun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 156 days.

(21) Appl. No.: 18/203,295

(22) Filed: May 30, 2023

(65) Prior Publication Data
US 2024/0130051 A1    Apr. 18, 2024

(30) Foreign Application Priority Data
Oct. 14, 2022   (KR) .......................... 10-2022-0132348

(51) Int. Cl.
*H05K 1/02* (2006.01)
*H05K 1/18* (2006.01)
*H05K 1/11* (2006.01)

(52) U.S. Cl.
CPC ........... *H05K 1/0298* (2013.01); *H05K 1/183* (2013.01); *H05K 1/185* (2013.01); *H05K 1/115* (2013.01)

(58) Field of Classification Search
CPC .... H05K 3/4697; H05K 1/0298; H05K 1/115; H05K 2203/308; H05K 3/4682; H05K 1/183; H05K 1/185; H05K 3/06; H01L 23/49822
See application file for complete search history.

(56) References Cited

U.S. PATENT DOCUMENTS

| 9,997,442 B1* | 6/2018 | Lin ......................... H01L 23/13 |
| 2015/0090688 A1 | 4/2015 | Ajoian |
| 2016/0113110 A1* | 4/2016 | Furusawa ............ H05K 1/0271 174/251 |
| 2016/0322295 A1* | 11/2016 | Kobayashi ........... H05K 3/4682 |
| 2017/0064825 A1* | 3/2017 | Ishihara ............... H05K 1/0298 |
| 2022/0262713 A1* | 8/2022 | Na .................... H01L 23/49838 |

FOREIGN PATENT DOCUMENTS

KR    10-2011-0104395 A    9/2011

* cited by examiner

*Primary Examiner* — Steven T Sawyer
(74) *Attorney, Agent, or Firm* — MORGAN, LEWIS & BOCKIUS LLP

(57) ABSTRACT

A printed circuit board: a first insulation layer; a first wiring layer embedded in the first insulation layer; a first via layer disposed in a first via of the first insulation layer; a second insulation layer disposed on the first insulation layer; a second wiring layer embedded in the second insulation layer; a second via layer disposed in a second via of the second insulation layer; and a cavity disposed in the first insulation layer and a portion of the second insulation layer. The cavity includes a first portion and a second portion disposed in the first insulation layer and having different widths, the first portion is disposed at a lateral side of the first wiring layer, the second portion is disposed at a lateral side of the first via layer, and a first width of the first portion is greater than a second width of the second portion.

22 Claims, 17 Drawing Sheets

PRINTED CIRCUIT BOARD AND MANUFACTURING METHOD THEREOF

CROSS-REFERENCE TO RELATED APPLICATION

This application claims priority to and the benefit of Korean Patent Application No. 10-2022-0132348 filed in the Korean Intellectual Property Office on Oct. 14, 2022, the entire contents of which are incorporated herein by reference.

TECHNICAL FIELD

The present disclosure relates to a printed circuit board and a manufacturing method thereof.

BACKGROUND

A printed circuit board is manufactured by forming a circuit pattern with a conductive material such as copper on an insulator, and as electronic devices in the IT field such as mobile phones are down-sizing, methods for forming a cavity in the printed circuit board and mounting electronic parts such as ICs, active elements, or passive elements in the cavity are proposed.

According to a depth of the cavity of the printed circuit board on which the electronic parts are mounted, heights of parts mounted on the printed circuit board from among the electronic parts are changeable.

The deeper the cavity of the printed circuit board is, the more the electronic parts may be mounted in the cavity, and an entire thickness of a package of the electronic parts and the printed circuit board may be reduced.

However, when the cavity is formed in the printed circuit board, it is difficult to adjust the depth of the cavity, and the circuit pattern may be damaged in order to form a deep cavity.

The above information disclosed in this Background section is only for enhancement of understanding of the background of the described technology, and therefore it may contain information that does not form the prior art that is already known in this country to a person of ordinary skill in the art.

SUMMARY

This disclosure has been made in an effort to provide a printed circuit board for forming a cavity with a desired depth without damaging a circuit pattern around a cavity, and a manufacturing method thereof.

The object of this disclosure is not limited to the above-described object, and it may be expanded in various ways in the range of the ideas and the areas of this disclosure.

An embodiment provides a printed circuit board including: a first insulation layer; a first wiring layer embedded in the first insulation layer; a first via layer disposed in a first via in the first insulation layer; a second insulation layer disposed on the first insulation layer; a second wiring layer embedded in the second insulation layer; a second via layer disposed in a second via in the second insulation layer; and a cavity disposed in the first insulation layer and a portion of the second insulation layer. The cavity may include a first portion and a second portion disposed in the first insulation layer and having different widths, the first portion may be disposed at a lateral side of the first wiring layer, the second portion may be disposed at a lateral side of the first via layer, and a first width of the first portion may be greater than a second width of the second portion.

The cavity may further include a third portion disposed in the portion of the second insulation layer, and the third portion may be disposed at a lateral side of the second wiring layer.

A depth of the first portion may be substantially equivalent to a thickness of the first wiring layer, and a depth of the second portion may be substantially equivalent to a thickness of the first via layer.

A depth of the third portion may be substantially equivalent to a thickness of the second wiring layer.

A third width of the third portion may be substantially equivalent to the first width.

The printed circuit board may further include a solder resist layer disposed below the first insulation layer. The cavity may further include a fourth portion in the solder resist layer, and a fourth width of the fourth portion may be greater than the first width and the second width.

The first wiring layer may be connected to the second wiring layer through the first via layer.

The printed circuit board may further include a third insulation layer disposed between the first insulation layer and the second insulation layer. The cavity may further include a fifth portion and a sixth portion disposed in the third insulation layer and having different widths.

The printed circuit board may further include: a third wiring layer embedded in the third insulation layer; and a third via layer in a third via of the third insulation layer. The fifth portion may be disposed at a lateral side of the third wiring layer, and the sixth portion may be disposed at a lateral side of the third via layer.

The printed circuit board may further include a plurality of protrusions protruding toward the cavity from the second insulation layer.

The first portion and the second portion of cavity may have a step.

Another embodiment provides a printed circuit board including: a first insulation layer; a first wiring layer embedded in the first insulation layer; a first via layer disposed in a first via in the first insulation layer; a second insulation layer disposed on the first insulation layer; a second wiring layer embedded in the second insulation layer; a second via layer in a second via of the second insulation layer; and a cavity including a first portion penetrating the first insulation layer and a second portion disposed in the second insulation layer. The second portion of the cavity may be disposed at a lateral side of the second wiring layer, and a depth of the second portion of the cavity may be substantially equivalent to a thickness of the second wiring layer.

Another embodiment provides a method for manufacturing a printed circuit board, including: forming a first wiring layer and a first sacrificial layer; forming a first insulation layer on the first wiring layer and the first sacrificial layer; forming a first via and an opening overlapping the first sacrificial layer in the first insulation layer; forming a first via layer in the first via of the first insulation layer, and forming a second sacrificial layer in the opening; forming a second wiring layer on the first insulation layer, and forming a third sacrificial layer on the second sacrificial layer; forming a second insulation layer on the second wiring layer and the third sacrificial layer; and removing the first sacrificial layer, the second sacrificial layer, and the third sacrificial layer.

The first sacrificial layer and the second sacrificial layer may have different widths.

The first sacrificial layer may be disposed at a lateral side of the first wiring layer and may have a thickness substantially the same as the first wiring layer, and the second sacrificial layer may be disposed at a lateral side of the first via layer and may have a thickness substantially the same as the first via layer.

The third sacrificial layer may be disposed at a lateral side of the second wiring layer, and may have a thickness substantially the same as the second wiring layer.

A width of the first sacrificial layer may be substantially equivalent to a width of the third sacrificial layer.

The method may further include: forming a third insulation layer between the first insulation layer and the second insulation layer; forming a third wiring layer disposed between the first via layer and the second wiring layer and embedded in the third insulation layer and a fourth sacrificial layer disposed between the second sacrificial layer and the third sacrificial layer; forming a third via layer disposed between the first via layer and the second wiring layer and in a third via of the third insulation layer, and a fifth sacrificial layer disposed on the fourth sacrificial layer; and removing the fourth sacrificial layer and the fifth sacrificial layer.

The fourth sacrificial layer may be disposed at a lateral side of the third wiring layer and may have a thickness substantially the same as the third wiring layer, and the fifth sacrificial layer may be disposed at a lateral side of the third via layer and may have a thickness substantially the same as the third via layer.

A portion of the second insulation layer may be disposed between the third sacrificial layer.

The method may further include forming a solder resist layer below the first insulation layer, wherein the solder resist layer may expose the first sacrificial layer.

According to the embodiments, the printed circuit board for forming the cavity with a desired depth without damaging the circuit pattern around the cavity and the manufacturing method may be provided.

The object of this disclosure is not limited to the above-described object, and it may be expanded in various ways in the range of the ideas and the areas of this disclosure.

DETAILED DESCRIPTION

Figure 1:
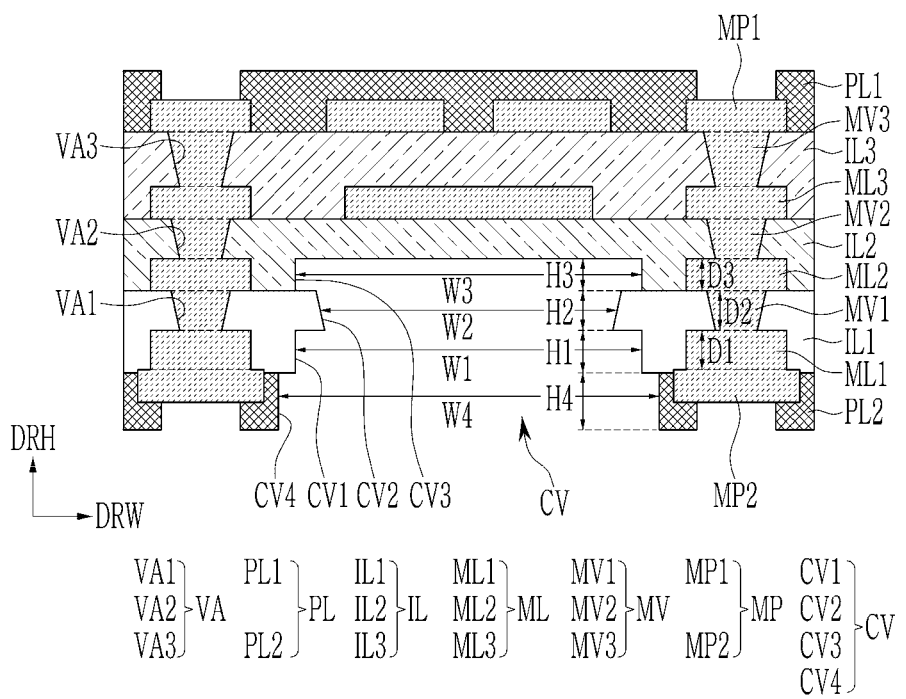
FIG. 1 shows a cross-sectional view of a printed circuit board according to an embodiment.

The embodiments will be described more fully hereinafter with reference to the accompanying drawings, in which embodiments are shown. As those skilled in the art would realize, the described embodiments may be modified in various different ways, all without departing from the spirit or scope of this disclosure.

Parts that are irrelevant to the description will be omitted to clearly describe the embodiments, and the same elements will be designated by the same reference numerals throughout the specification.

The accompanying drawings are provided only in order to allow embodiments disclosed in the present specification to be easily understood and are not to be interpreted as limiting the spirit disclosed in the present specification, and it is to be understood that the embodiments include all modifications, equivalents, and substitutions without departing from the scope and spirit of this disclosure.

The size and thickness of each configuration shown in the drawings are arbitrarily shown for better understanding and ease of description, but the embodiments are not limited thereto. The thicknesses of layers, films, panels, regions, etc., are enlarged for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise", and variations such as "comprises" or "comprising", will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

When it is described that a part is "connected" to another part, the part may be "directly connected" to the other element, may be "connected" to the other part through a third part, or may be connected to the other part physically or electrically, and they may be referred to by different titles depending on positions or functions, but respective portions that are substantially integrated into one body may be connected to each other.

Various embodiment and variations will now be described in detail with reference to accompanying drawings.

A printed circuit board according to an embodiment will now be described with reference to FIG. 1. FIG. 1 shows a cross-sectional view of a printed circuit board according to an embodiment.

Referring to FIG. 1, the printed circuit board may include a plurality of stacked insulation layers IL, a plurality of wiring layers ML embedded in the insulation layers IL, a plurality of via layers MV in a plurality of vias VA of the insulation layers IL, a plurality of pad layers MP, a plurality of solder resist layers PL, and cavities CV formed on some of the insulation layers IL.

The insulation layers IL may include a first insulation layer IL1, a second insulation layer IL2 on the first insulation layer IL1, and a third insulation layer IL3 on the second insulation layer IL2.

The wiring layers ML may include a first wiring layer ML1 embedded in the first insulation layer IL1, a second wiring layer ML2 embedded in the second insulation layer IL2, and a third wiring layer ML3 embedded in the third insulation layer IL3.

The via layers MV may include a first via layer MV1 in a first via VA1 formed in the first insulation layer IL1, a second via layer MV2 in a second via VA2 formed in the second insulation layer IL2, and a third via layer MV3 in a third via VA3 of the third insulation layer IL3.

A plurality of pad layers MP may include a first pad layer MP1 on the third insulation layer IL3 and a second pad layer MP2 below the first insulation layer IL1.

Portion of the first wiring layer ML1 may be connected to a portion of the second wiring layer ML2 through the first via layer MV1, a portion of the second wiring layer ML2 may be connected to a portion of the third wiring layer ML3 through the second via layer MV2, a portion of the third wiring layer ML3 may be connected to a portion of the first pad layer MP1 through the third via layer MV3, and the second pad layer MP2 may be connected to the first wiring layer ML1.

The cavity CV may penetrate the first insulation layer IL1 in a height direction DRH, and may be in a portion of the second insulation layer IL2.

The solder resist layer PL may include a first solder resist layer PL1 on the third insulation layer IL3 and exposing a portion of the first pad layer MP1, and a second solder resist layer PL2 below the first insulation layer IL1 and exposing a portion of the second pad layer MP2.

The cavity CV may include a first portion CV1 and a second portion CV2 in the first insulation layer IL1 and having different widths, a third portion CV3 in a portion of the second insulation layer IL2, and a fourth portion CV4 in the second solder resist layer PL2.

The first portion CV1 of the cavity CV is disposed at a lateral side of the first wiring layer ML1, the second portion CV2 of the cavity CV is disposed at a lateral side of the first via layer MV1, the third portion CV3 of the cavity CV is disposed at a lateral side of the second wiring layer ML2, and the fourth portion CV4 of the cavity CV is disposed at a lateral side of the second solder resist layer PL2.

In a planar direction DRW that is perpendicular to the height direction DRH, the first portion CV1 of the cavity CV in the first insulation layer IL1 may have a first width W1, the second portion CV2 of the cavity CV in the first insulation layer IL1 may have a second width W2, the third portion CV3 of the cavity CV in the portion of the second insulation layer IL2 may have a third width W3, and the fourth portion CV4 of the cavity CV in the second solder resist layer PL2 may have a fourth width W4.

The first width W1 of the first portion CV1 of the cavity CV may be different from the second width W2 of the second portion CV2 of the cavity CV.

The first width W1 of the first portion CV1 of the cavity CV may be substantially equivalent to the third width W3 of the third portion CV3 of the cavity CV, and differing from this, the first width W1 may be different from the third width W3. In one example, a substantial meaning may include a slight difference due to a process error. For example, substantially the same thickness/width or substantially equivalent thickness/width may include not only a case in which the thickness/width is completely the same, but also a case in which the thickness/width is approximately the same due to the process error.

The fourth width W4 of the fourth portion CV4 of the cavity CV may be greater than the first width W1, the second width W2, and the third width W3.

A side wall of the cavity CV may not be disposed in a line but may have steps in the height direction DRH.

In the height direction DRH, a first depth H1 of the first portion CV1 of the cavity CV may be substantially equivalent to a first thickness D1 of the first wiring layer ML1 embedded in the first insulation layer IL1, and a second depth H2 of the second portion CV2 of the cavity CV may be substantially equivalent to a second thickness D2 of the first via layer MV1 in the first via VA1 of the first insulation layer IL1.

A sum of the first depth H1 of the first portion CV1 of the cavity CV and the second depth H2 of the second portion CV2 may be equivalent to the thickness of the first insulation layer IL1.

A third depth H3 of the third portion CV3 of the cavity CV may be substantially equivalent to a third thickness D3 of the second wiring layer ML2 embedded in the second insulation layer IL2.

A fourth depth H4 of the fourth portion CV4 of the cavity CV formed in the second solder resist layer PL2 may be equivalent to a thickness of the second solder resist layer PL2.

An entire depth HT of the cavity CV may be substantially equivalent to a sum of the third thickness D3 of the second wiring layer ML2 embedded by the second insulation layer IL2, the thickness of the first insulation layer IL1, and the thickness of the second solder resist layer PL2.

According to the embodiment, the cavity CV may be formed on a portion of the second insulation layer IL2, the first insulation layer IL1, and the second solder resist layer PL2, and the depth HT of the cavity CV may be substantially equivalent to a sum of the third thickness D3 of the second wiring layer ML2 embedded in the second insulation layer IL2, the thickness of the first insulation layer IL1, and the thickness of the second solder resist layer PL2. The remain portion of the second insulation layer IL2 remains in the cavity CV, and the wiring layers ML embedded in the insulation layers IL are not exposed by the cavity CV so the circuit pattern around the cavity CV may not be damaged, and the entire depth HT of the cavity CV may be adjusted by adjusting the thickness of the second wiring layer ML2 embedded in the second insulation layer IL2 and the thickness of the first insulation layer IL1. As described, according to the embodiment, the cavity CV with a desired depth without circuit pattern damage around the cavity CV may be formed.

When the electronic parts are mounted on a substrate (not shown), the electronic parts are disposed in the cavity CV of the printed circuit board so when the cavity CV becomes deeper, the entire thickness of the electronic parts package may be reduced.

According to the embodiment, the cavity CV with a desired depth may be formed without damaging the circuit pattern around the cavity CV, thereby reducing the entire thickness of the electronic parts package without generation of defects.

A method for manufacturing a printed circuit board according to an embodiment will now be described with reference to FIG. 2 to FIG. 13 together with FIG. 1. FIG. 2 to FIG. 13 show cross-sectional views of a method for manufacturing a printed circuit board according to an embodiment.

Figure 2:
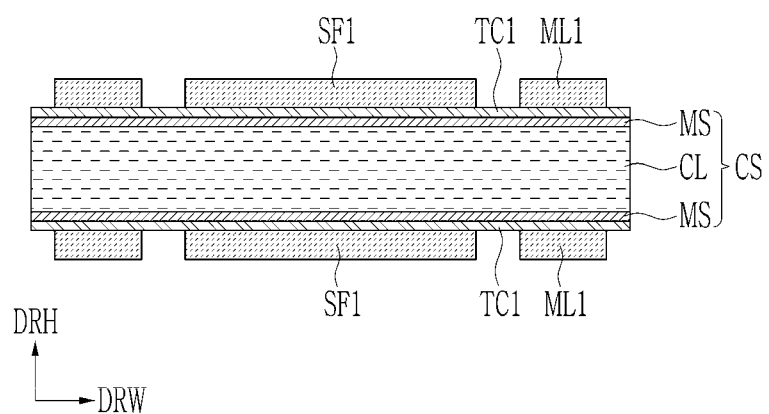
FIG. 2 to FIG. 13 show cross-sectional views of a method for manufacturing a printed circuit board according to an embodiment.

Referring to FIG. 2, a first copper foil layer TC1 and a first wiring layer ML1 may be formed on a carrier substrate CS including a core CL and thin film metal layers MS stacked on respective sides of the core CL. In this instance, a first sacrificial layer SF1 disposed on the position on which the cavity CV will be formed may be formed. As the first sacrificial layer SF1 is formed with the first wiring layer ML1, it is made of the same material as the first wiring layer ML1 and may have the thickness substantially the same as the first thickness D1 of the first wiring layer ML1.

Figure 3:
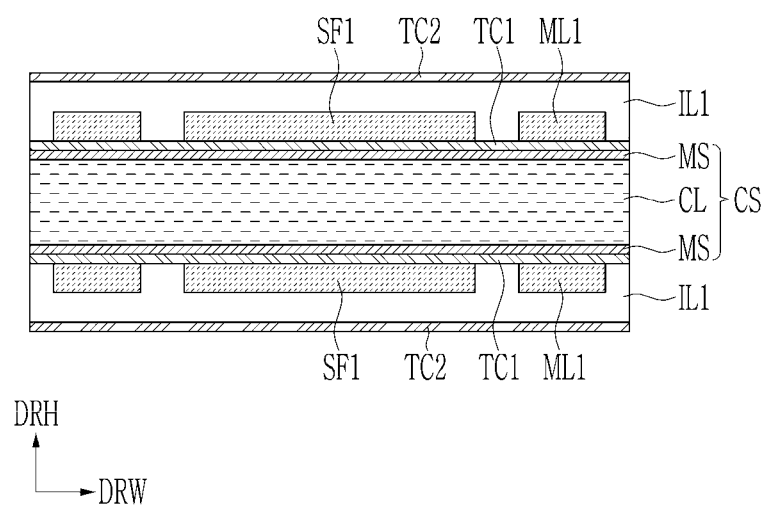

As shown in FIG. 3, the first wiring layer ML1 is embedded in the first insulation layer IL1 by forming the first insulation layer IL1 and the second copper foil layer TC2 on the first wiring layer ML1.

Figure 4:
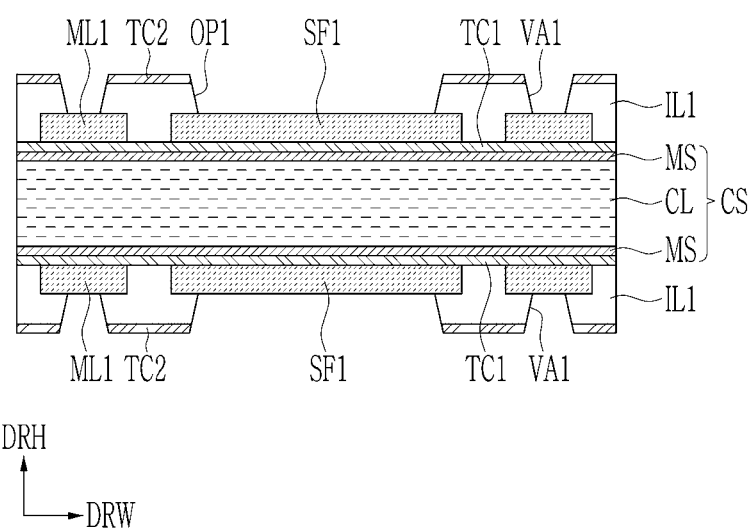

Referring to FIG. 4, a first via VA1 is formed in the first insulation layer IL1. In this instance, an opening OP1 for exposing the first sacrificial layer SF1 is formed.

Figure 5:
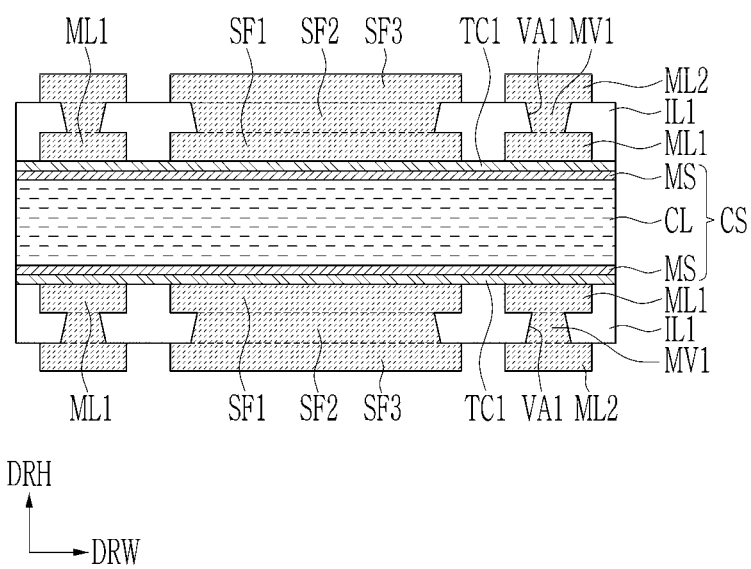

Referring to FIG. 5, a first via layer MV1 is formed in the first via VA1 in the first insulation layer IL1, and a second wiring layer ML2 is formed on the first insulation layer IL1. Simultaneously, a second sacrificial layer SF2 is formed in the opening OP1, and a third sacrificial layer SF3 connected to the second sacrificial layer SF2 is formed on the first insulation layer IL1. The second copper foil layer TC2 is then removed. The second sacrificial layer SF2 and the third sacrificial layer SF3 may be formed on the position on which the cavity CV will be formed together with the first sacrificial layer SF1.

Figure 6:
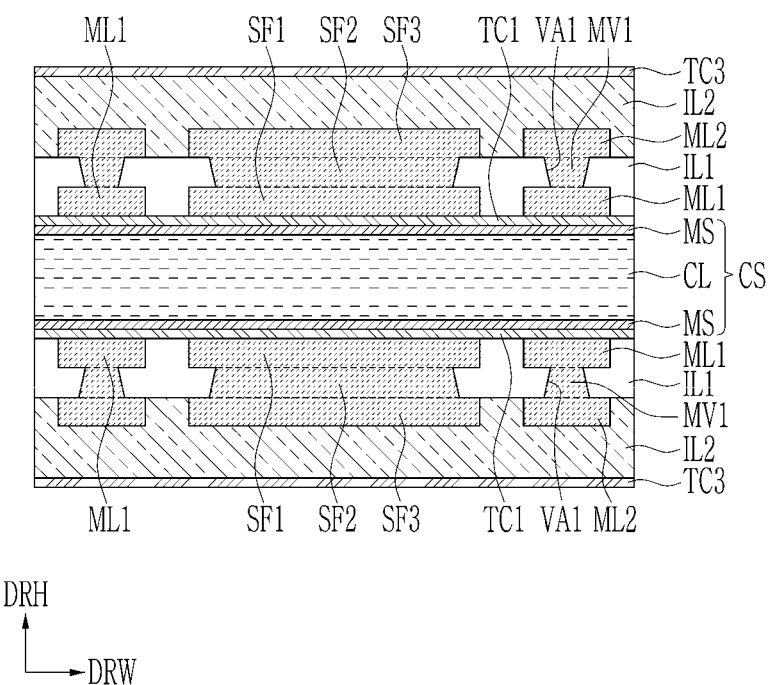

As shown in FIG. 6, the second insulation layer IL2 and a third copper foil layer TC3 are stacked on the second wiring layer ML2 and the third sacrificial layer SF3 to embed the second wiring layer ML2 in the second insulation layer IL2.

Figure 7:
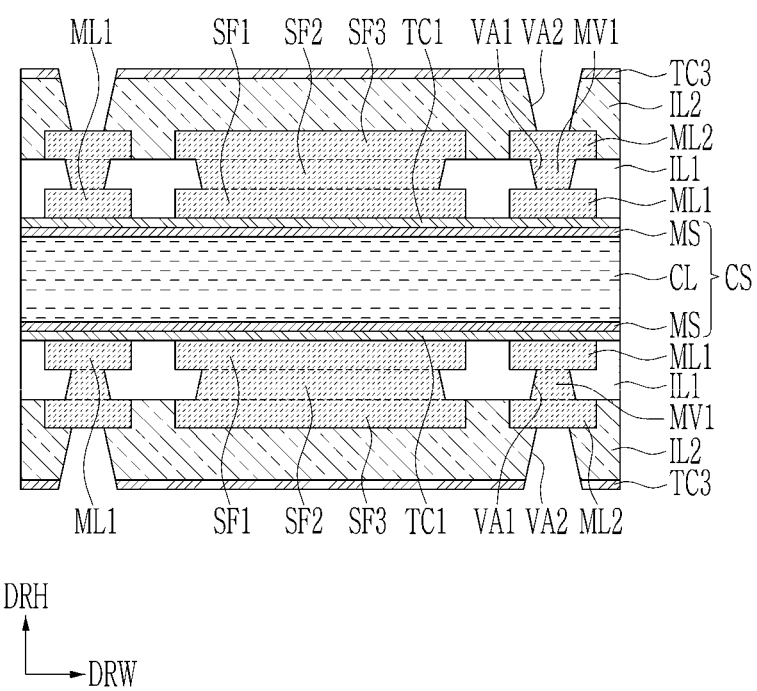

Referring to FIG. 7, a second via VA2 is formed in the second insulation layer IL2.

Figure 8:
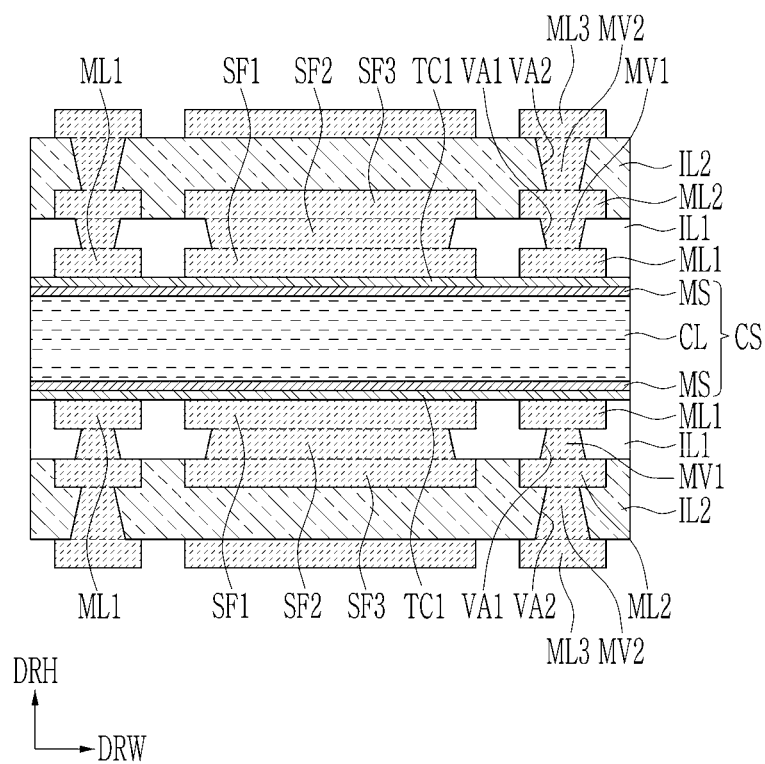

Referring to FIG. 8, a second via layer MV2 is formed in the second via VA2 of the second insulation layer IL2, and a third wiring layer ML3 is formed on the second insulation layer IL2. The third copper foil layer TC3 is then removed.

Figure 9:
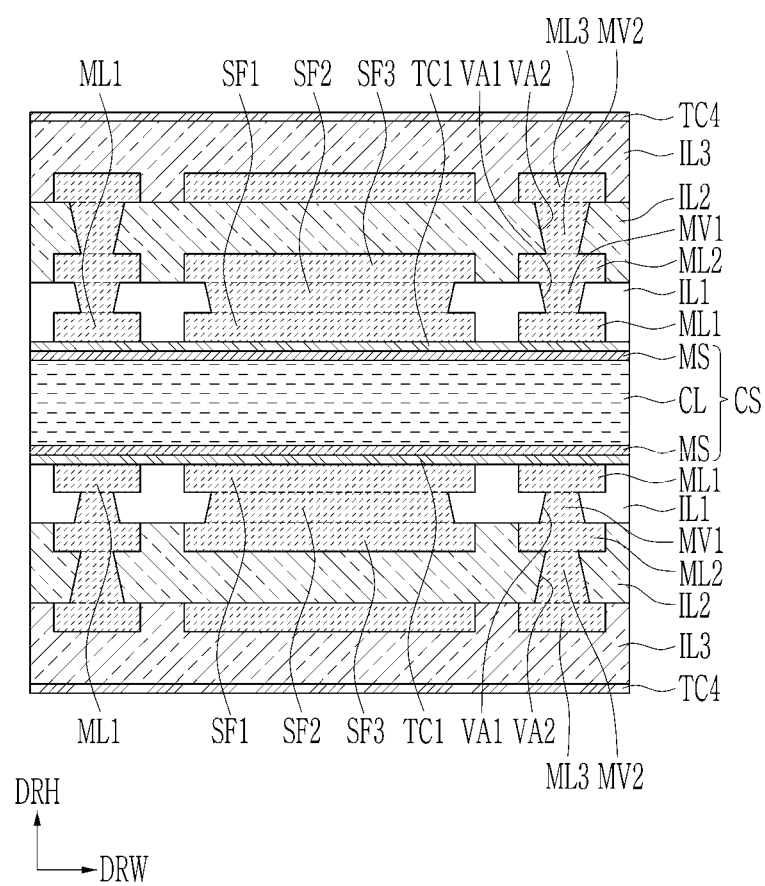

Referring to FIG. 9, the third wiring layer ML3 is embedded in the third insulation layer IL3 by stacking the third insulation layer IL3 and the fourth copper foil layer TC4 on the third wiring layer ML3.

Figure 10:
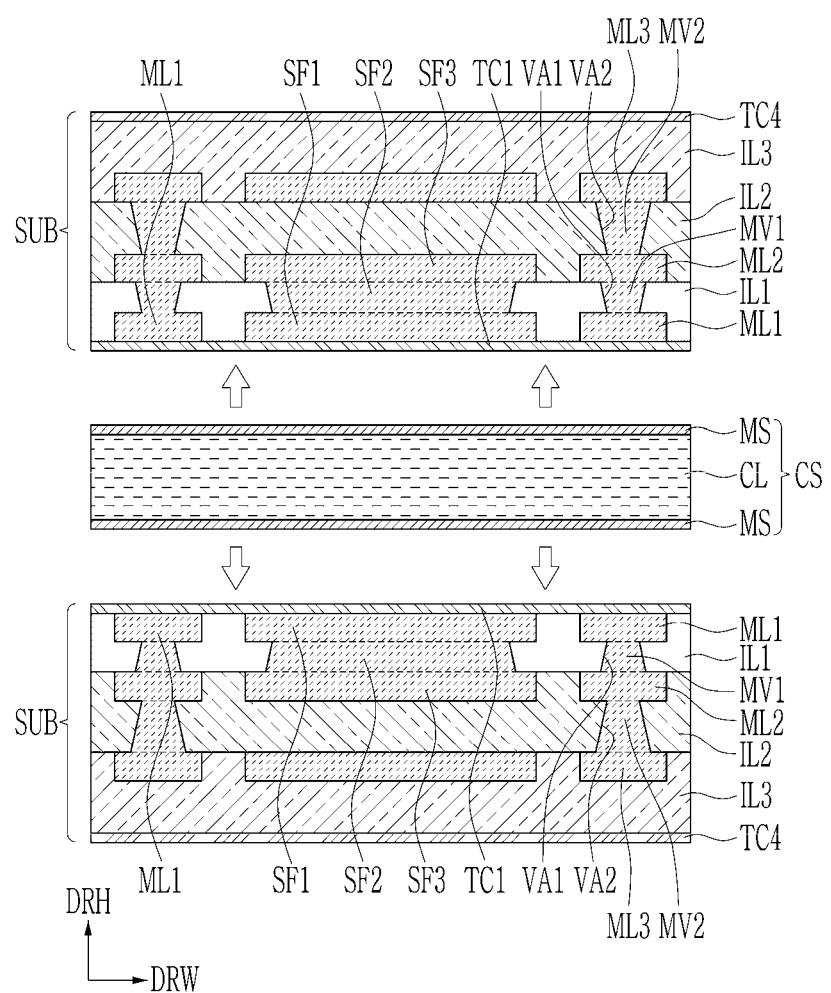

As shown in FIG. 10, the substrates SUB are peeled off from respective sides of the carrier substrate CS.

One substrate SUB of the substrates SUB peeled from the carrier substrate CS will now be described.

Figure 11:
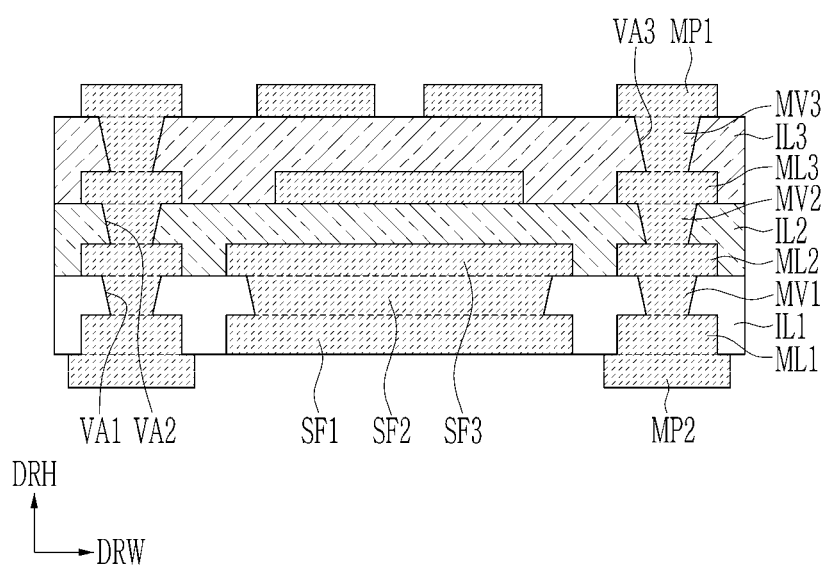

As shown in FIG. 11, the first copper foil layer TC1 and the fourth copper foil layer TC4 are removed from the substrate SUB, a third via VA3 is formed in the third insulation layer IL3, a third via layer MV3 is formed in the third via VA3, a first pad layer MP1 is formed on the third insulation layer IL3, and a second pad layer MP2 is formed below the first insulation layer IL1.

Figure 12:
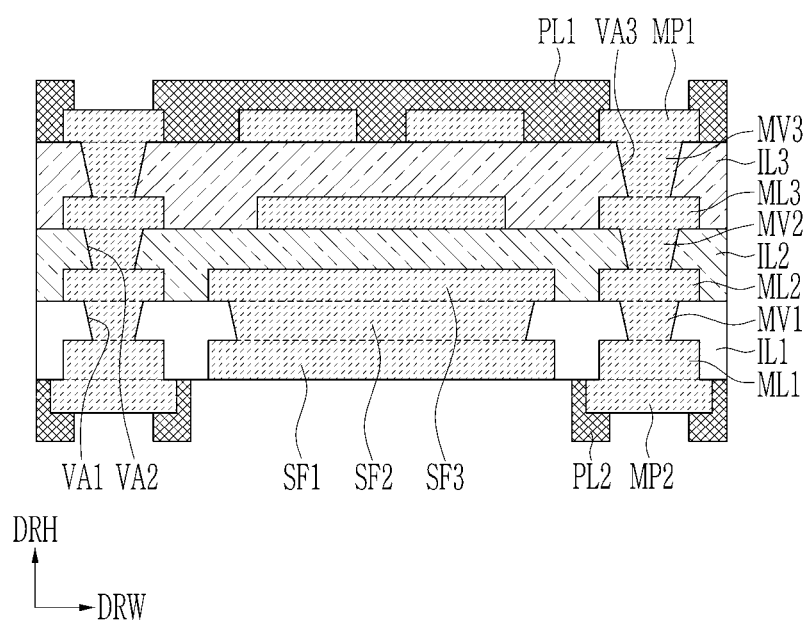

Referring to FIG. 12, a first solder resist layer PL1 is formed on the third insulation layer IL3, and a second solder resist layer PL2 is formed below the first insulation layer IL1. The first solder resist layer PL1 may expose a portion of the first pad layer MP1, and the second solder resist layer PL2 may expose a portion of the second pad layer MP2 and the first sacrificial layer SF1.

Figure 13:
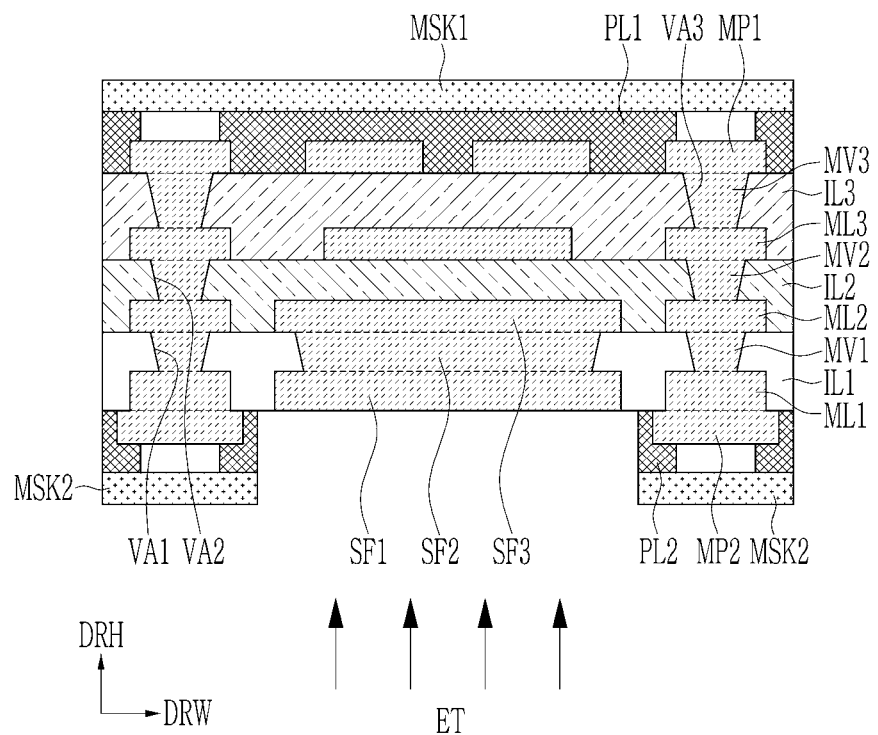

Referring to FIG. 13, a first mask layer MSK1 is disposed on the first solder resist layer PL1, and a second mask layer MSK2 is disposed below the second solder resist layer PL2. A portion excluding a region in which the cavity CV will be formed may be covered by the first mask layer MSK1 and the second mask layer MSK2.

With the first mask layer MSK1 and the second mask layer MSK2 as etching masks, the first sacrificial layer SF1, the second sacrificial layer SF2, and the third sacrificial layer SF3 disposed in the region in which the cavity CV will be formed are removed to form the cavity CV penetrating the first insulation layer IL1 and formed in a portion the second insulation layer IL2.

The first mask layer MSK1 and the second mask layer MSK2 are removed.

According to the method for manufacturing a printed circuit board of the embodiment, the first sacrificial layer SF1 and the second sacrificial layer SF2 are formed with the same layers as the first wiring layer ML1 and first via layer MV1 to penetrate the first insulation layer IL1, the third sacrificial layer SF3 is formed on the first insulation layer IL1 so that it may be embedded by the second insulation layer IL2, and the first sacrificial layer SF1, the second sacrificial layer SF2, and the third sacrificial layer SF3 are etched with the mask layers MSK1 and MSK2 as etching masks to thus form the cavity CV in the printed circuit board. Therefore, the cavity CV penetrates the second solder resist layer PL2 and the first insulation layer IL1 and is formed in a portion of the second insulation layer IL2, and the depth HT of the cavity CV may be substantially equivalent to the sum of the third thickness D3 of the second wiring layer ML2 embedded by the second insulation layer IL2, the thickness of the first insulation layer IL1, and the thickness of the second solder resist layer PL2.

The second insulation layer IL2 remains in the cavity CV, the wiring layers ML embedded in the insulation layers IL are not exposed by the cavity CV so the circuit pattern around the cavity CV may not be damaged, and the entire depth HT of the cavity CV may be adjusted by adjusting the thickness of the second wiring layer ML2 embedded by the second insulation layer IL2 and the thickness of the first insulation layer IL1. As described, according to the method for manufacturing a printed circuit board of the embodiment, the cavity CV with a desired depth without damaging the circuit pattern around the cavity CV may be formed.

Figure 14:
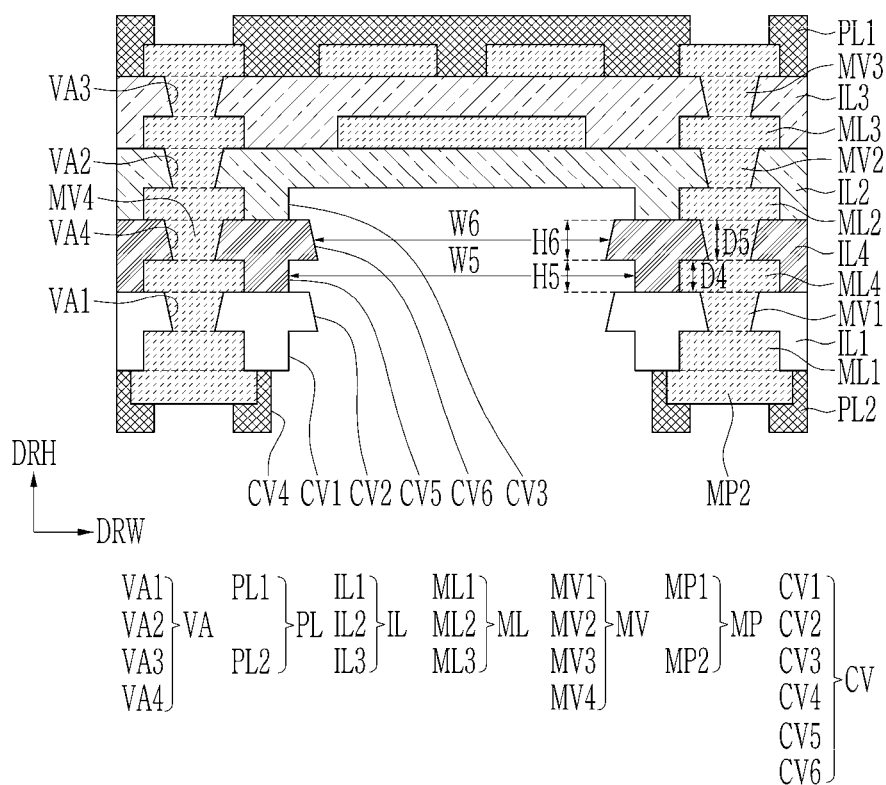
FIG. 14 shows a cross-sectional view of a printed circuit board according to another embodiment.

A printed circuit board according to another embodiment will now be described with reference to FIG. 14. FIG. 14 shows a cross-sectional view of a printed circuit board according to another embodiment.

Referring to FIG. 14, the printed circuit board according to the present embodiment is similar to the printed circuit board according to an embodiment described with reference to FIG. 1. No same constituent elements will be described.

Referring to FIG. 14, differing from the printed circuit board according to an embodiment described with reference to FIG. 1, the printed circuit board may further include a fourth insulation layer IL4 disposed between the first insulation layer IL1 and the second insulation layer IL2, a fourth wiring layer ML4 embedded in the fourth insulation layer IL4, and a fourth via layer MV4 in the fourth via VA4 of the fourth insulation layer IL4.

The cavity CV may penetrate the first insulation layer IL1 and the fourth insulation layer IL4 in the height direction DRH, and may be in a portion of the second insulation layer IL2.

The cavity CV may include a first portion CV1 and a second portion CV2 formed on the first insulation layer IL1 and having different widths, a third portion CV3 formed on a portion of the second insulation layer IL2, and a fourth portion CV4 formed on the second solder resist layer PL2.

The first portion CV1 of the cavity CV is disposed at a lateral side of the first wiring layer ML1, the second portion CV2 of the cavity CV is disposed at a lateral side of the first via layer MV1, the third portion CV3 of the cavity CV is disposed at a lateral side of the second wiring layer ML2, and the fourth portion CV4 of the cavity CV is disposed at a lateral side of the second solder resist layer PL2.

The cavity CV may further include a fifth portion CV5 and a sixth portion CV6 in the fourth insulation layer IL4 and having different widths.

The fifth portion CV5 of the cavity CV may be disposed at a lateral side of the fourth wiring layer ML4, and the sixth portion CV6 of the cavity CV may be disposed at a lateral side of the fourth via layer MV4.

In the planar direction DRW that is perpendicular to the height direction DRH, the fifth portion CV5 of the cavity CV in the fourth insulation layer IL4 may have a fifth width W5, the sixth portion CV6 of the cavity CV in the fourth insulation layer IL4 may a sixth width W6, and the fifth width W5 of the fifth portion CV5 of the cavity CV may be different from the sixth width W6 of the sixth portion CV6 of the cavity CV.

The fifth width W5 of the fifth portion CV5 of the cavity CV may be equivalent to the first width W1 of the first portion CV1 of the cavity CV, and the sixth width W6 of the sixth portion CV6 of the cavity CV may be substantially equivalent to the second width W2 of the second portion CV2 of the cavity CV, and differing from this, the fifth width W5 may be different from the first width W1, and the sixth width W6 may be different from the second width W2.

The fourth width W4 of the fourth portion CV4 of the cavity CV may be greater than the first width W1, the second width W2, the third width W3, the fifth width W5, and the sixth width W6.

The side wall of the cavity CV may not be disposed in a line but may have steps in the height direction DRH.

In the height direction DRH, the fifth depth H5 of the fifth portion CV5 of the cavity CV may be substantially equivalent to the fourth thickness D4 of the fourth wiring layer ML4 embedded in the fourth insulation layer IL4, and the sixth depth H6 of the sixth portion CV6 of the cavity CV may be substantially equivalent to the fifth thickness D5 of the fourth via layer MV4 in the fourth via VA4 of the fourth insulation layer IL4.

The sum of the fifth depth H5 of the fifth portion CV5 of the cavity CV and the sixth depth H6 of the sixth portion CV6 of the second portion CV2 may be equivalent to the thickness of the fourth insulation layer IL4.

The entire depth HT of the cavity CV may be substantially equivalent to the sum of the third thickness D3 of the second wiring layer ML2 embedded in the second insulation layer IL2, the thickness of the first insulation layer IL1, the thickness of the fourth insulation layer IL4, and the thickness of the second solder resist layer PL2.

According to the printed circuit board of the embodiment, the cavity CV is in a portion of the second insulation layer IL2, the first insulation layer IL1, the fourth insulation layer IL4, and the second solder resist layer PL2, and the depth HT of the cavity CV may be substantially equivalent to the sum of the third thickness D3 of the second wiring layer ML2 embedded by the second insulation layer IL2, the thickness of the first insulation layer 11_1, the thickness of the fourth insulation layer IL4, and the thickness of the second solder resist layer PL2. The second insulation layer IL2 remains in the cavity CV, the wiring layers ML embedded in the insulation layers IL are not exposed by the cavity CV so the circuit pattern around the cavity CV may not be damaged, and the entire depth HT of the cavity CV may be adjusted by adjusting the thickness of the first insulation layer IL1 and the thickness of the fourth insulation layer IL4 in addition to the thickness of the second wiring layer ML2 embedded by the second insulation layer IL2. As described, according to the printed circuit board of the embodiment, the cavity CV with a desired may be formed depth without damaging the circuit pattern around the cavity CV.

Many characteristics of the printed circuit board according to an embodiment described with reference to FIG. 1 are applicable to the printed circuit board according to the present embodiment.

Figure 15:
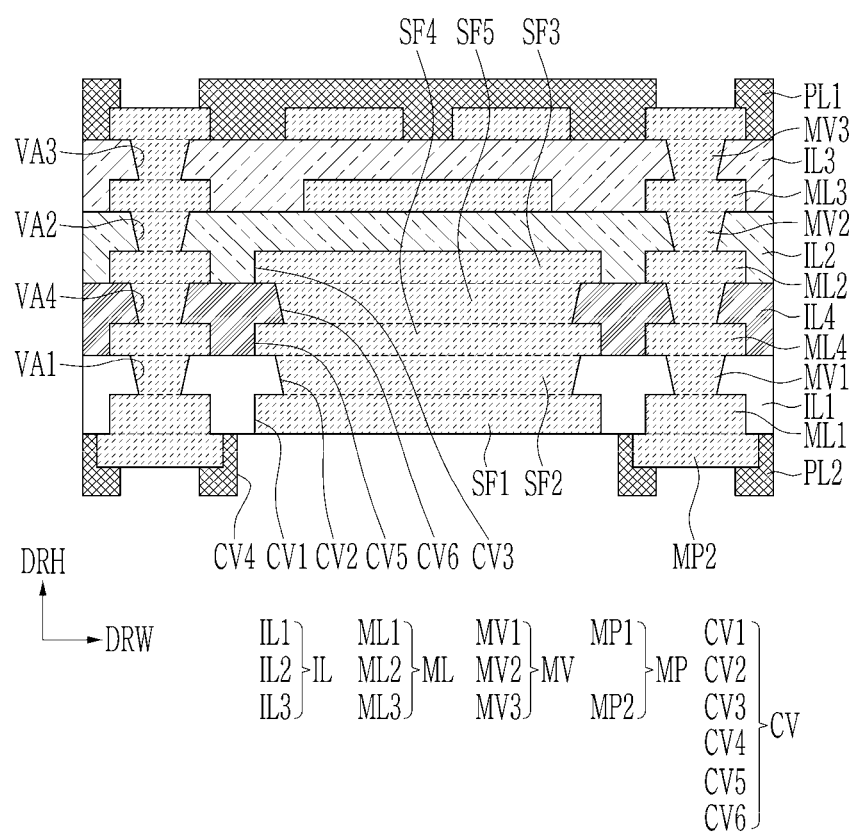
FIG. 15 shows a cross-sectional view of a method for manufacturing a printed circuit board according to another embodiment.

A method for manufacturing a printed circuit board according to another embodiment will now be described with reference to FIG. 15 together with FIG. 14. FIG. 15 shows a cross-sectional view of a method for manufacturing a printed circuit board according to another embodiment.

Referring to FIG. 15, a first sacrificial layer SF1 and a second sacrificial layer SF2 are formed to penetrate the first insulation layer 11_1, a fourth sacrificial layer SF4 and a fifth sacrificial layer SF5 are formed on the same layer as the fourth wiring layer ML4 and the fourth via layer MV4 to penetrate the fourth insulation layer IL4, a third sacrificial layer SF3 is formed on the fourth insulation layer IL4 to be embedded by the second insulation layer IL2, and the first sacrificial layer SF1, the second sacrificial layer SF2, a fourth sacrificial layer (not shown), a fifth sacrificial layer (not shown), and the third sacrificial layer SF3 are etched with the mask layers MSK1 and MSK2 as etching masks, thereby forming the cavity CV in the printed circuit board.

Many characteristics of the method for manufacturing a printed circuit board according to an embodiment described with reference to FIG. 2 to FIG. 13 are applicable to the method for manufacturing a printed circuit board according to the present embodiment.

Figure 16:
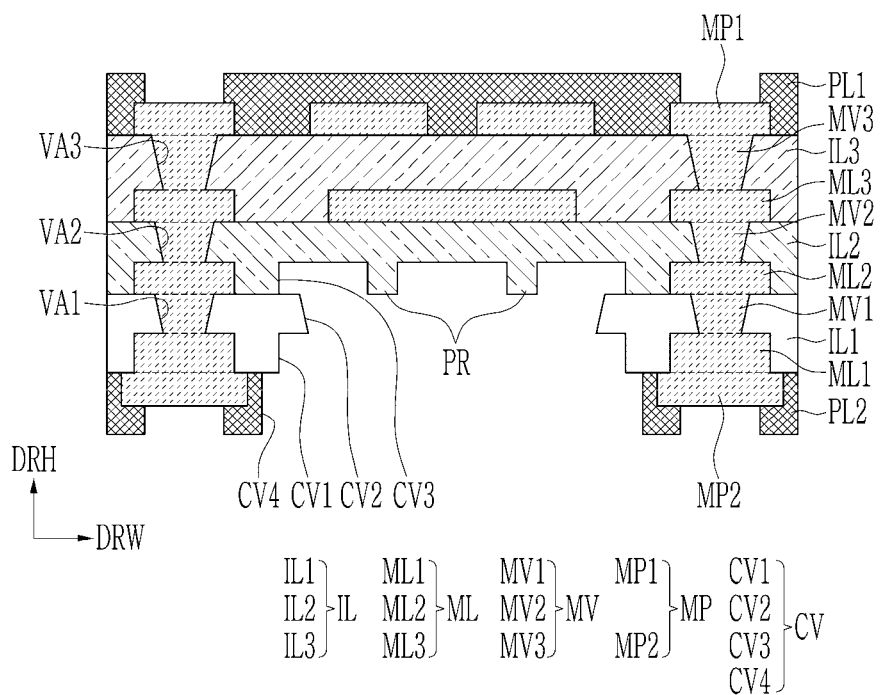
FIG. 16 shows a cross-sectional view of a printed circuit board according to another embodiment.

A printed circuit board according to another embodiment will now be described with reference to FIG. 16. FIG. 16 shows a cross-sectional view of a printed circuit board according to another embodiment.

Referring to FIG. 16, the printed circuit board according to the present embodiment is similar to the printed circuit board according to the embodiment described with reference to FIG. 1. Detailed descriptions on the same constituent elements may be omitted.

Referring to FIG. 16, differing from the printed circuit board according to the embodiment described with reference to FIG. 1, the printed circuit board according to the present embodiment may further include a plurality of protrusions PR formed with the second insulation layer IL2 along an upper boundary of the cavity CV. The thickness of the protrusions PR may be substantially equivalent to the third thickness D3 of the second wiring layer ML2 embedded by the second insulation layer IL2.

The protrusion PR may function as a spacer. The protrusions PR formed along the upper boundary of the cavity CV are further included, so when the electronic parts are mounted in the cavity CV, a space may be generated around the electronic parts, and the heat generated by the electronic parts may be spread through the space.

In a like way of the printed circuit board according to an embodiment described with reference to FIG. 1, according to the printed circuit board according to the present embodiment, the side wall of the cavity CV may not be disposed in a line but may have steps in the height direction DRH.

In the height direction DRH, the first depth H1 of the first portion CV1 of the cavity CV may be substantially equivalent to the first thickness D1 of the first wiring layer ML1 embedded by the first insulation layer IL1, and the second depth H2 of the second portion CV2 of the cavity CV may be substantially equivalent to the second thickness D2 of the first via layer MV1 in the first via VA1 of the first insulation layer IL1.

The sum of the first depth H1 of the first portion CV1 of the cavity CV and the second depth H2 of the second portion CV2 may be equivalent to the thickness of the first insulation layer IL1.

The third depth H3 of the third portion CV3 of the cavity CV may be substantially equivalent to the third thickness D3 of the second wiring layer ML2 embedded in the second insulation layer IL2.

The fourth depth H4 of the fourth portion CV4 of the cavity CV formed in the second solder resist layer PL2 may be equivalent to the thickness of the second solder resist layer PL2.

The entire depth HT of the cavity CV may be substantially equivalent to the sum of the third thickness D3 of the second wiring layer ML2 embedded by the second insulation layer IL2, the thickness of the first insulation layer IL1, and the thickness of the second solder resist layer PL2.

In the planar direction DRW that is perpendicular to the height direction DRH, the first portion CV1 of the cavity CV in the first insulation layer IL1 may have the first width W1, the second portion CV2 of the cavity CV in the first insulation layer IL1 may have the second width W2, the third portion CV3 of the cavity CV in a portion of the second insulation layer IL2 may have the third width W3, and the fourth portion CV4 of the cavity CV in the second solder resist layer PL2 may have the fourth width W4.

The first width W1 of the first portion CV1 of the cavity CV may be different from the second width W2 of the second portion CV2 of the cavity CV.

The first width W1 of the first portion CV1 of the cavity CV may be substantially equivalent to the third width W3 of the third portion CV3 of the cavity CV, and differing from this, the first width W1 may be different from the third width W3.

The fourth width W4 of the fourth portion CV4 of the cavity CV may be greater than the first width W1, the second width W2, and the third width W3.

According to the printed circuit board according to the present embodiment, the cavity CV with a desired depth can be formed without damaging the circuit pattern around the cavity CV so the entire thickness of the electronic parts package may be reduced without generation of defects.

Figure 17:
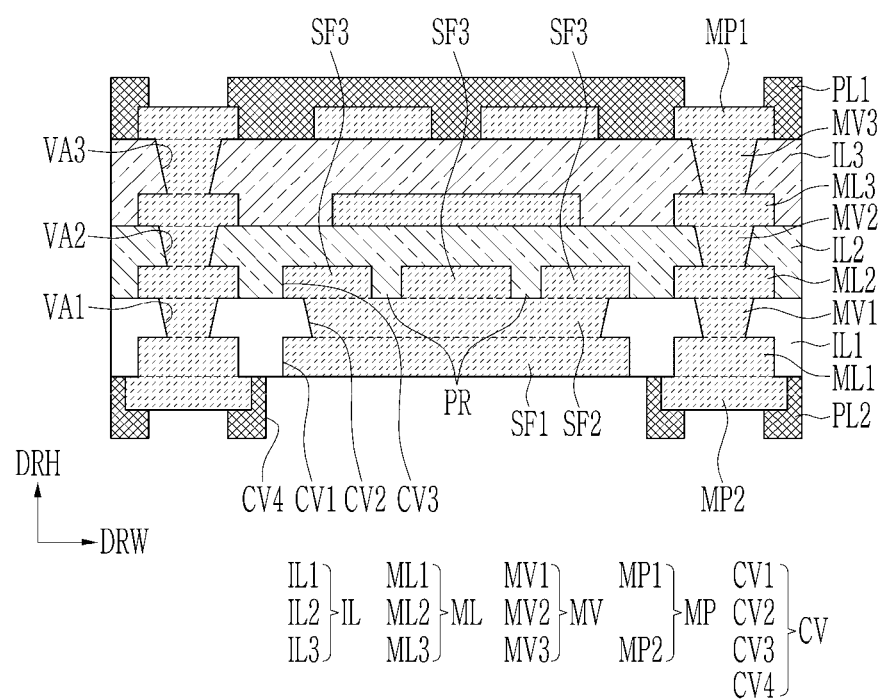
FIG. 17 shows a cross-sectional view of a method for manufacturing a printed circuit board according to another embodiment.

A method for manufacturing a printed circuit board according to another embodiment will now be described with reference to FIG. 17 together with FIG. 16. FIG. 17 shows a cross-sectional view of a method for manufacturing a printed circuit board according to another embodiment.

Referring to FIG. 17, a first sacrificial layer SF1 and a second sacrificial layer SF2 are formed with the same layers as the first wiring layer ML1 and the first via layer MV1 to penetrate the first insulation layer IL1, a third sacrificial layer SF3 is formed on the first insulation layer 11_1 to be embedded by the second insulation layer IL2, and the first sacrificial layer SF1, the second sacrificial layer SF2, and the third sacrificial layer SF3 are etched with the mask layers MSK1 and MSK2 as etching masks, thereby forming the cavity CV in the printed circuit board.

The third sacrificial layer SF3 is not formed on the entire position in which the cavity CV will be formed, and may not be formed on a portion on which a plurality of protrusions PR will be formed. The second insulation layer IL2 is disposed on the portion on which the protrusions PR will be formed, the third sacrificial layer SF3 is removed, and the second insulation layer IL2 disposed at the lateral side of the third sacrificial layer SF3 becomes the protrusion PR.

Many characteristics of the method for manufacturing a printed circuit board according to an embodiment described with reference to FIG. 2 to FIG. 13 are applicable to the method for manufacturing a printed circuit board according to the present embodiment.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A printed circuit board comprising: a first insulation layer; a first wiring layer embedded in the first insulation layer; a first via layer disposed in a first via in the first insulation layer; a second insulation layer disposed on the first insulation layer; a second wiring layer embedded in the second insulation layer; a second via layer disposed in a second via in the second insulation layer; and a cavity disposed in the first insulation layer and a portion of the second insulation layer, wherein the cavity includes a first portion and a second portion disposed in the first insulation layer and having different widths, the first portion is disposed at a lateral side of the first wiring layer and the second portion is disposed at a lateral side of the first via layer, and a first width of the first portion is greater than a second width of the second portion, and the second portion and the entire first via layer are tapered in a same direction in a cross-sectional view of the printed circuit board.

2. The printed circuit board of claim 1, wherein
the cavity further includes a third portion disposed in the portion of the second insulation layer, and
the third portion is disposed at a lateral side of the second wiring layer.

3. The printed circuit board of claim 2, wherein
a depth of the third portion is substantially equivalent to a thickness of the second wiring layer.

4. The printed circuit board of claim 2, wherein
a third width of the third portion is substantially equivalent to the first width.

5. The printed circuit board of claim 2, further comprising
a solder resist layer disposed below the first insulation layer,
wherein the cavity further includes a fourth portion in the solder resist layer, and
a fourth width of the fourth portion is greater than the first width and the second width.

6. The printed circuit board of claim 1, wherein
a depth of the first portion is substantially equivalent to a thickness of the first wiring layer, and a depth of the second portion is substantially equivalent to a thickness of the first via layer.

7. The printed circuit board of claim 1, wherein
the first wiring layer is connected to the second wiring layer through the first via layer.

8. The printed circuit board of claim 1, further comprising
a third insulation layer disposed between the first insulation layer and the second insulation layer,
wherein the cavity further includes a fifth portion and a sixth portion disposed in the third insulation layer and having different widths.

9. The printed circuit board of claim 8, further comprising
a third wiring layer embedded in the third insulation layer; and
a third via layer disposed in a third via of the third insulation layer, wherein the fifth portion is disposed at a lateral side of the third wiring layer and the sixth portion is disposed at a lateral side of the third via layer.

10. The printed circuit board of claim 8, further comprising
a plurality of protrusions protruding toward the cavity from the second insulation layer.

11. The printed circuit board of claim 1, further comprising a plurality of protrusions protruding toward the cavity from the second insulation layer.

12. The printed circuit board of claim 1, wherein
the first portion and the second portion of the cavity have a step.

13. A printed circuit board comprising: a first insulation layer; a first wiring layer embedded in the first insulation layer; a first via layer disposed in a first via in the first insulation layer; a second insulation layer disposed on the first insulation layer; a second wiring layer embedded in the second insulation layer; a second via layer disposed in a second via of the second insulation layer; and a cavity including a first portion penetrating the first insulation layer and a second portion disposed in the second insulation layer, wherein the second portion of the cavity is disposed at a lateral side of the second wiring layer, and a depth of the second portion of the cavity is substantially equivalent to a thickness of the second wiring layer, the first portion comprises a portion disposed at a lateral side of the first via layer, and the portion of the first portion and the entire first via layer are tapered in a same direction in a cross-sectional view of the printed circuit board.

14. The printed circuit board of claim 13, wherein the first portion and the second portion of the cavity have a step.

15. The printed circuit board of claim 13, further comprising
a plurality of protrusions protruding toward the cavity from the second insulation layer.

16. The printed circuit board of claim 1, wherein
the second portion and the first via layer are tapered in the same direction from a bottom of the cavity to the first portion of the cavity.

17. A printed circuit board comprising:
a first insulation layer;
a first wiring layer embedded in the first insulation layer;
a first via layer disposed in a first via in the first insulation layer;
a second insulation layer disposed on the first insulation layer;
a second wiring layer embedded in the second insulation layer;
a second via layer disposed in a second via in the second insulation layer;
a solder resist layer disposed below the first insulation layer; and
a cavity disposed in the first insulation layer and a portion of the second insulation layer,
wherein the cavity includes a first portion and a second portion disposed in the first insulation layer and having different widths,
the first portion is disposed at a lateral side of the first wiring layer and the second portion is disposed at a lateral side of the first via layer,
a first width of the first portion is greater than a second width of the second portion,
the cavity further includes another portion in the solder resist layer, and
a width of the another portion of the cavity is greater than the first width and the second width.

18. The printed circuit board of claim 17, wherein
the cavity further includes a third portion disposed in the portion of the second insulation layer, and
the third portion is disposed at a lateral side of the second wiring layer.

19. The printed circuit board of claim 18, wherein
a depth of the third portion is substantially equivalent to a thickness of the second wiring layer.

20. The printed circuit board of claim 18, wherein
a third width of the third portion is substantially equivalent to the first width.

21. The printed circuit board of claim 17, wherein
a depth of the first portion is substantially equivalent to a thickness of the first wiring layer, and a depth of the second portion is substantially equivalent to a thickness of the first via layer.

22. The printed circuit board of claim 17, wherein
the first wiring layer is connected to the second wiring layer through the first via layer.

* * * * *